United States Patent [19]

Simon

[11] 4,009,061
[45] Feb. 22, 1977

[54] ETCHANT AND METHOD OF ETCHING TIN OXIDE FILM

[75] Inventor: Paul W. Simon, Millington, N.J.

[73] Assignee: Burroughs Corporation, Detroit, Mich.

[22] Filed: Aug. 14, 1975

[21] Appl. No.: 604,649

[52] U.S. Cl. .............................. 156/635; 96/36.2; 156/659; 252/79.2
[51] Int. Cl.² ..................... B29C 17/08; C23F 1/02
[58] Field of Search ................ 156/3, 4, 8, 15, 17; 96/36.2, 38.3; 252/79.2

[56] References Cited
UNITED STATES PATENTS

| 3,210,214 | 10/1965 | Smith | 156/8 X |
| 3,489,624 | 1/1970 | Lake et al. | 156/15 |
| 3,615,465 | 10/1971 | Bullinger | 156/3 X |
| 3,668,089 | 6/1972 | Chase et al. | 156/3 X |
| 3,837,944 | 9/1974 | Cole | 156/4 |

Primary Examiner—William A. Powell
Attorney, Agent, or Firm—Kevin R. Peterson; Robert A. Green

[57] ABSTRACT

The invention comprises a method of forming a pattern of conductive tin oxide anodes on a glass plate by forming a layer of tin oxide on the plate, masking off predetermined patterns with a layer of resist material, and dipping the resist-coated plate in an etchant comprising a mineral acid in which chromium is dissolved and to which some other active metal is added during the dip process as required.

6 Claims, 2 Drawing Figures

ETCHANT AND METHOD OF ETCHING TIN OXIDE FILM

BACKGROUND OF THE INVENTION

A display panel of the type known as a PANAPLEX panel comprises a gas-filled envelope containing groups of cathode electrode segments, each of which is adapted to display a character, and each of which is associated with an anode electrode. The anode electrode preferably comprises a thin film of tin oxide formed on the panel face plate. In one method of manufacturing such a panel, the face plates are purchased with the anode patterns already formed. Such face plates are relatively expensive. The present invention provides an inexpensive etchant and simple method of etching tin oxide films.

DESCRIPTION OF THE PREFERRED EMBODIMENTS

Figure 1:
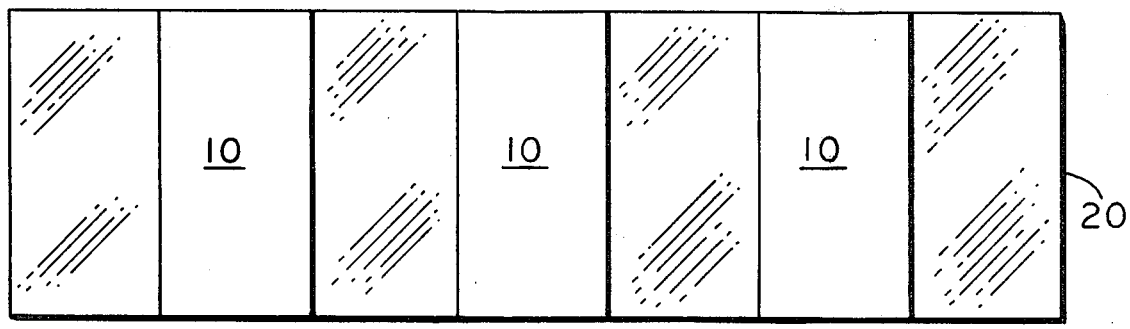
FIG. 1 is a plan view of a glass plate carrying a pattern of tin oxide films which can be formed using the etchant and method of the invention.
Figure 2:
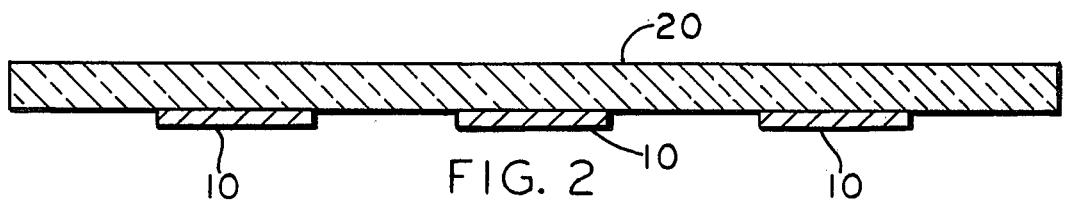
FIG. 2 is a sectional view of the plate of FIG. 1.

The etchant of the invention, in quantities which can be scaled up or down as required, consists of 3 liters of 50 percent hydrochloric acid (6N) and 20 grams of chromium metal. The solution is heated to 90° C with constant stirring to dissolve the chromium. The mixture is then ready for use. Chromium is used, initially, to render the solution active, but lower-cost zinc powder is added thereafter to maintain the activity or potency of the solution during the etching process. The amount of zinc added depends upon the quantity of tin oxide etched.

The method of the invention is used to form a pattern of tin oxide films 10 on a plate 20 of insulating material such as glass, with the plate initially having a surface completely coated with a film of tin oxide to be etched. The method of the invention includes the following steps.

1. An alkali-soluble etch resist is screened on the surface of the plate 20 and dried.
2. The plate carrying the resist in the desired pattern is immersed in the etching solution described above, with the solution at about 90° C. The plate is held in the etching solution for about one to four minutes.
3. The plate is then washed and immersed in a solvent for the resist.
4. The plate is processed as required in washing and drying operations.

After the foregoing steps are carried out, the plate is left with a clear pattern of films 10.

As noted above, as the foregoing steps are carried out continuously on coated plates, zinc powder is added to the etching solution to maintain its strength. In a typical run of 100 pieces of glass, about 1 × 6 inches, 67 grams of zinc were added to the etching solution.

The overall reaction sequence of the etching operation is as follows:

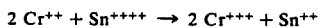

The tin oxide coating is stannic oxide ($Sn^{++++}$), and it is reduced to stannous oxide $Sn^{++}$ which is soluble in the acid solution, thus completing the etching and removal from areas unprotected by etch resist.

Additional reactions include:
$Cr^\circ \rightarrow Cr^{++}$ in hot acid solution
$Cr^{++} \rightarrow Cr^{+++}$ by oxidation processes as surface contact with air.

With continued use, the chromous ion $Cr^{++}$ is spent and chromic ion $Cr^{+++}$ is concentrated in the solution. The chromic ion at this point must be reduced in order to reactivate the solution. The reactivation can be done with reducing agents such as active metals, or electrolytically. The use of zinc powder is particularly effective. The overall effect is an indirect reduction of tin oxide with zinc.*

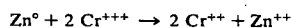

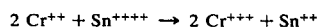

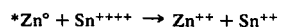

The reaction is ideal as the reducing $Cr^{++}$ ion is soluble and a uniform etch is obtained. Any type of regenerative system could be used if the material has a sufficient activation potential to reduce tin oxide.

What is claimed is:

1. The method of etching tin oxide films comprising the steps of
   providing an etchant made up of a solution of chromium metal in hydrochloric acid to form chromous ions, and
   dipping a plate carrying a film of tin oxide in said etchant.

2. The method of claim 1 and including the step of adding zinc powder during the etching process to convert chromic ions to chromous ions.

3. The method of forming a pattern of tin oxide films comprising the steps of
   coating a glass plate with a layer of tin oxide,
   applying a pattern of photoresist material to said layer of tin oxide,
   photographically exposing said layer of photoresist with a predetermined pattern of radiation,
   removing the unexposed portions of said layer of tin oxide with a solution of chromium in nitric acid, and
   removing the remaining photoresist material from said layer of tin oxide to leave a pattern of areas of tin oxide.

4. A solution for etching transparent conductive films of tin oxide comprising
   hydrochloric acid and chromium dissolved in said acid to produce chromous ions which can reduce tin oxide to tin, the tin being soluble in the acid.

5. The solution defined in claim 4 wherein said solution also includes zinc for converting chromic ions to chromous ions.

6. The solution of claim 4 wherein a unit quantity of said solution includes three liters of 50% hydrochloric acid (6N) and 20 grams of chromium metal dissolved to form chromous ions.

* * * * *